United States Patent
Kawashima et al.

[11] Patent Number: 5,925,185
[45] Date of Patent: Jul. 20, 1999

[54] MAGNETIC FIELD-APPLIED FABRICATION METHOD FOR A SEMICONDUCTOR SINGLE CRYSTAL AND AN APPARATUS THEREFOR

[75] Inventors: Shigeki Kawashima; Hiroshi Inagaki; Hirotaka Nakajima, all of Kanagawa, Japan

[73] Assignee: Komatsu Electronic Metals Co., Ltd., Kanagawa, Japan

[21] Appl. No.: 08/878,772

[22] Filed: Jun. 19, 1997

[30] Foreign Application Priority Data

Jun. 20, 1996 [JP] Japan ................................ P. 8-181210

[51] Int. Cl.⁶ .................................................. C30B 15/22
[52] U.S. Cl. ............................ 117/13; 117/32; 117/208; 117/917; 117/932
[58] Field of Search ............................ 117/13, 32, 51, 117/917, 932, 208

[56] References Cited

U.S. PATENT DOCUMENTS

| | | | |
|---|---|---|---|
| 4,592,895 | 6/1986 | Matsutani | 422/106 |
| 5,178,720 | 1/1993 | Frederick | 156/618.1 |
| 5,359,959 | 11/1994 | Fusegawa | 117/13 |

Primary Examiner—Robert Kunemund
Attorney, Agent, or Firm—Sughrue, Mion, Zinn, Macpeak & Seas, PLLC

[57] ABSTRACT

A method for fabricating a semiconductor single crystal by the MCZ method by which it is possible to pull large diameter and heavy semiconductor single crystals without breaking the contraction portion, is provided.

In the contracting step, change the shape of the crystal growth interface by making the range of the temperature fluctuation caused by convection in the vicinity of the melt surface more than 5° C. so as to eliminate the dislocation in the contracted portion. When a transverse magnetic field is applied by magnets 6,6, the magnetic field intensity is set below 2000 Gauss to properly change the shape of the crystal growth interface to form the contracted portion 10. Thus, even though the diameter of the contracted portion 10 is larger than normal, free dislocation is achieved. After the dislocation is eliminated, the magnetic field intensity is recovered and shoulder 11 is formed. When a cusp magnetic field is applied, the contracting is performed when the magnetic field intensity of one of the upper-and-lower magnets being increased while the magnetic field intensity of another magnet is decreased or the upper-and-lower magnets are moved in a vertical direction to make the vicinity of the melt surface similar to a longitudinal magnetic field. After dislocation is eliminated, the magnetic field intensity of the upper-and-lower magnets or the position of the magnets is recovered.

8 Claims, 3 Drawing Sheets

MAGNETIC FIELD-APPLIED FABRICATION METHOD FOR A SEMICONDUCTOR SINGLE CRYSTAL AND AN APPARATUS THEREFOR

BACKGROUND OF THE INVENTION

1. Field of the Invention

The present invention relates to a magnetic field-applied fabrication method for a semiconductor single crystal and an apparatus therefor, and in particular to a fabrication method which is possible to pull heavy semiconductor single crystal without dislocation even though the diameter of the contracted portion of the semiconductor single crystal is large.

2. Description of the Prior Art

The magnetic field-applied Czochralski crystal growth method (hereinafter called the MCZ method) is a method by which silicon single crystals are grown by the Czochralski method (hereinafter called the CZ method) while a magnetic field is applied to the melt by magnets surrounding a semiconductor single crystal fabrication apparatus to increase the dynamic viscosity coefficient of the melt. As the convection of the melt is inhibited by the action of the magnetic field, the temperature fluctuation near the melt surface is reduced, and thus it is possible to grow silicon single crystals stably. Moreover, as the reaction between melt and quartz crucible ($SiO_2$) is inhibited or promoted, it is an effective method for controlling the oxygen concentration of the silicon single crystals.

The pulling of silicon single crystals by the MCZ method like that of the CZ method, includes immersing seed crystals mounted on seed chucks in the melt of a polycrystal silicon, followed by pulling the seed chucks and then growing the silicon single crystals. As dislocations occur in the seed crystal due to the heat impact imparted thereto during the dipping of it in the melt, the silicon single crystal is first grown thinner and longer in the contracting step to prevent the dislocation, then the diameter of the silicon single crystal is enlarged to a predetermined size in the shoulder-forming step, and finally the silicon single crystal is delivered to the body-forming step. The magnetic field intensity during each steps is maintained at a predetermined value.

However, in the fabrication of silicon single crystal by the MCZ method, the convection of the melt is inhibited by the application of the magnetic field, resulting in a reduction of the fluctuation of the temperature near the melt surface. This stabilize the solid-liquid interface, and thus the dislocation in the seed crystals can not be eliminated in the right and left directions and thus remains in the interior of the silicon single crystal. Accordingly, in order to completely eliminate any dislocation, when the MCZ method is used for pulling silicon single crystals, the diameter of the contracted portion must be further contracted until the dislocation is eliminated. In the fabrication of a silicon single crystal by the CZ method, the weight of the pulled silicon single crystal is limited by the diameter of the contracted portion. If the weight exceeds the limit, the contracted portion breaks, and there is the danger that the single crystal may drop. The possibility of the single crystal dropping is higher when using the MCZ method than when using the CZ method. Moreover, with the enlargement of silicon single crystals in recent years, the weight thereof increases, and thus it is more difficult to pull large-diameter silicon crystals by the MCZ method.

SUMMARY OF THE INVENTION

In view of the above mentioned problems in the prior art, an object of the invention is to provide a method for fabricating a semiconductor single crystal by the MCZ method by which it is possible to safely pull large-diameter and heavy semiconductor single crystals without breaking the contracted portion.

In order to attain the above object, the method for fabricating a semiconductor single crystal of the present invention is characterized by, in the contracting step prior to the shoulder-forming step, changing the shape of the crystal growth interface by keeping the range of the temperature fluctuation caused by convection in the vicinity of the melt surface, more than 5° C. so as to eliminate the dislocation.

In the fabrication of the semiconductor single crystal, when a transversal magnetic field is applied, the contracting is performed with a magnetic field intensity reduced to less than 2000 Gauss, and after dislocation is eliminated, the magnetic field intensity is returned to the original intensity and the semiconductor single crystal is pulled. Moreover, when a cusp magnetic field is applied, the contracting is performed by increasing the magnetic field intensity of one of the upper-and-lower magnets which form the cusp magnetic field while reducing the magnetic field intensity of other magnet or the upper-and-lower magnets are moved in a vertical direction to make the vicinity of the melt surface similar to a longitudinal magnetic field, and after dislocation is eliminated, the magnetic field intensity of the upperand-lower magnets or the position of the magnets is returned to the original state and the semiconductor single crystal is pulled.

A first method of the present invention shows, magnetic field applied method of fabricating a semiconductor single crystal, comprising steps of: immersing a seed crystal in a melt; forming a contracted portion by pulling up the seed crystal at a predetermined velocity so as to have a small diameter while applying a magnetic field to the melt; forming a shoulder portion by pulling up the seed crystal so as to have a diameter grown larger gradually while applying the magnetic field to the melt; and forming a straight cylindrical portion by pulling up the seed crystal so as to have a same diameter longitudinally while applying the magnetic field to the melt; wherein the step of forming a contracted portion is performed in the state of changing the shape of the crystal growth interface by keeping the range of the temperature fluctuation caused by convection in the vicinity of the melt surface more than 5° C. so as to eliminate dislocation in the contracted portion.

The second method of the present invention shows, that the step of forming the contracted portion is performed while applying a transversal magnetic field having intensity below 2000 Gauss, and the step of forming the shoulder portion is performed while applying the transversal magnetic field having a predetermined intensity more than that in the step of forming the contracted portion.

The third method of the present invention shows, that the magnetic field is a cusp magnetic field formed by upperand-lower magnets and the step of forming the contracted portion is performed while increasing a magnetic field intensity of one of the upper-and-lower magnets and decreasing a magnetic field intensity of the other of the upper-and-lower magnets so as to make the vicinity of the melt surface similar to a longitudinal magnetic field, and the step of forming the shoulder portion is performed while applying the cusp magnetic field having a predetermined intensity. The forth method of the present invention shows, that the magnetic field is a cusp magnetic field formed by upper-and-lower magnets and the step of forming the contracted portion is performed while moving the upper-andlower magnets in a vertical direction so as to make the vicinity of the melt surface similar to a longitudinal magnetic field, and the step of forming the shoulder portion is performed after recovering the position of the upper-and-lower magnets.

The fifth of the present invention shows an apparatus for fabricating a semiconductor single crystal, comprising: a crucible filled with a raw material; a heater for melting the raw material to a melt; a magnetic means for applying a magnetic field to the melt in the crucible; a lifting means for lifting a seed crystal immersed in the melt; and for controlling the magnetic means and changing the magnetic filed applied to the melt with syncronizing the lifting means; wherein in the step of forming a contracted portion, the magnet controlling means is controllable to keep the range of the temperature fluctuation caused by convection in the vicinity of the melt surface, more than 5° C., thereby eliminate dislocation in the contracted portion.

The sixth apparatus of the present invention shows that the controlling means controls the step of forming the contracted portion to be performed while applying a transversal magnetic field having intensity below 2000 Gauss, and the step of forming the shoulder portion is performed while applying the transversal magnetic field having a predetermined intensity more than that in the step of forming the contracted portion.

The seventh apparatus of the present invention shows that the magnetic field is a cusp magnetic field formed by upper-and-lower magnets and the step of forming the contracted portion is performed while increasing a magnetic field intensity of one of the upper-and-lower magnets and decreasing a magnetic field intensity of the other of the upper-and-lower magnets so as to make the vicinity of the melt surface similar to a longitudinal magnetic field, and the step of forming the shoulder portion is performed while applying the cusp magnetic field having a predetermined intensity.

The eighth apparatus of the present invention shows that the magnetic field is a cusp magnetic field formed by upperand-lower magnets and the step of forming the contracted portion is performed while moving the upper-and-lower magnets in a vertical direction so as to make the vicinity of the melt surface similar to a longitudinal magnetic field, and the step of forming the shoulder portion is performed after recovering the position of the upper-and-lower magnets.

BRIEF DESCRIPTION OF THE DRAWINGS

The fabrication method of semiconductor single crystal of the invention is hereinafter described with reference to the preferred embodiments and accompanying drawings in which.

DESCRIPTION OF THE PREFERRED EMBODIMENT

The invention relates to a fabrication method for semiconductor single crystal by which when a large- diameter, heavy semiconductor single crystal is pulled by the MCZ method, the contracted portion does not break and propagation of dislocation in seed crystals can be prevented. According to the invention, in the contracting step of the fabrication of semiconductor single crystal by the MCZ method, as the temperature fluctuation in the vicinity of the melt surface is properly generated to change the shape of the crystal growth interface, dislocation is thus easily eliminated at the peripheral surface of the contracted portion. Accordingly, even though the contracted portion has a diameter that is suitable for pulling heavy semiconductor single crystal, dislocation is eliminated.

When a transversal magnetic field is applied in the fabrication of a semiconductor single crystal, in the contracting step, by setting the magnetic field intensity below 2000 Gauss, the shape of the crystal growth interface is properly changed. Accordingly, even though the diameter of the contracted portion is larger than normal, dislocation is eliminated.

Moreover, when a cusp magnetic field is applied in the fabrication of semiconductor single crystal, in contracting step, by changing the magnetic field intensity of the up-and-low magnets or changing the positions of the up-and-low magnets, in the vicinity of the melt surface a magnetic field similar to a longitudinal magnetic field is formed, and thus the shape of the crystal growth interface is properly changed. Accordingly, even though the diameter of the contraction portion is larger than normal, dislocation is eliminated.

Figure 1:
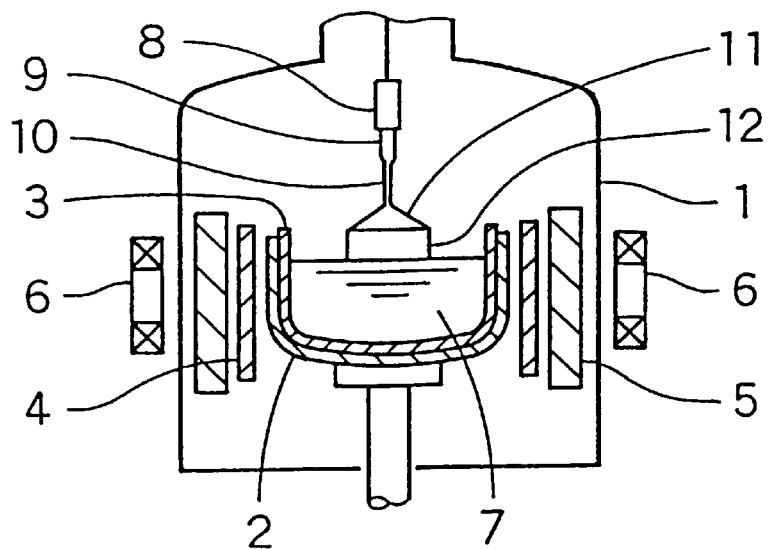
FIG. 1 is sectional schematic view of the main portions of transversal magnetic field applied fabrication apparatus of a semiconductor single crystal.

Reference is made to FIG. 1 which is a sectional schematic view of the main portions of a transversal magnetic field applied fabrication apparatus for a semiconductor single crystal. This fabrication apparatus for a semiconductor single crystal is the same as the normal apparatus for fabricating a semiconductor single crystal by the CZ method. A graphite crucible 2 is rotatably and elevatedly mounted in the main chamber 1, and a quartz crucible 3 is received in the graphite crucible 2. The periphery of the graphite crucible 3 is provided with a cylindrical heater 4 and an adiabatic cylinder 5. Moreover, vertically-mounted ring-shaped magnets 6,6 are provided at the right and left sides of the main chamber 1 so that the ring-shaped magnets 6,6 are facing each other and a face perpendicular to the both surface have a diameter of the crucible.

The quartz crucible 3 is filled with raw polysilicon material. The raw material is heated by the heater 4, and melted into the melt 7. Thereafter, the seed crystal 9 mounted on the seed chuck 8 is immersed in the melt 7, and then the seed chuck 8 and the graphite crucible 2 is rotated in the same direction or opposite direction while the seed chuck 8 is pulled to grow the single crystal. When electrical current flow through the the magnets 6,6, a transverse magnetic field having a predetermined intensity, is horizontally applied to the melt 7 and thus the convection of the melt in the upper-and-lower direction orthogonal with the magnetic lines is inhibited, and accordingly the temperature fluctuationis reduced.

At the beginning of the contracting step, as the temperature fluctuation range in the vicinity of the surface of the melt 7 is allowed to be greater than 5° C., the magnetic field intensity is reduced to less than 2000 gauss. Accordingly, convection in the upper-and-lower direction of the melt 7 is activated, and the shape of the crystal growth interface, have been kept stable by then, changes properly. The seed crystal 9 gradually contracts in this state, and finally the diameter of the contracted portion 10 becomes 4 mm Φ. In this period, any dislocation in the vertical direction of the seed crystal 9 disappears at the periphery thereof even though the diameter of the contracted portion 10 is larger than 4 mm, and thus does not propagate to the shoulder 11 formed below.

After it is confirmed that dislocation-free state is achieved in the contracted portion 10, the single crystal is moved to the shoulder-forming step. At this time, the magnetic field intensity is gradually increased to its original predetermined value. In the shoulder-forming step, the diameter of the grown single crystal silicon is gradually increased to a predetermined dimension, and finally becomes the body portion 12. The magnetic field intensity after the shoulder-forming step is maintained at a predetermined value. In the case that a fluctuation range of a temperature near a surface of a melt 7, is lower than 5° C. at the beginning of contracting step, because of being the shape of the crystal growth interface stable it is difficult to eliminate the dislocation.

Figure 2:
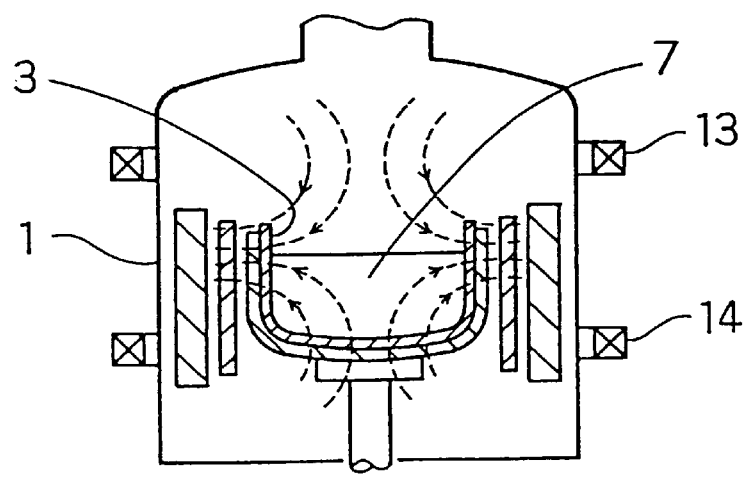
FIG. 2 is a sectional schematic view of the main portions of cusp magnetic field applied fabrication apparatus of a semiconductor single crystal.

Reference is then made to FIG. 2 which is a sectional schematic view of the main portions of a cusp magnetic field applied fabrication apparatus for a semiconductor single crystal. The periphery of the main chamber 1 is provided a ring-shaped upper magnet 13 and a ring-shaped lower magnet 14. In a normal state, the magnetic lines of the upper magnet 13 are curved in an almost horizontal direction above the surface of the melt 9 as shown in the dot lines in FIG. 2. The magnetic lines of the lower magnet 14 are curved in an almost horizontal direction below the surface of the melt 9 and penetrate the side wall of the quartz crucible 3 almost vertically. Accordingly, the melt convection along the side wall of the quartz crucible 3 is inhibited. On the other hand, the magnetic field in the vicinity of the crystal growth interface is almost zero, and thus the convection of the melt is not inhibited.

Figure 3:
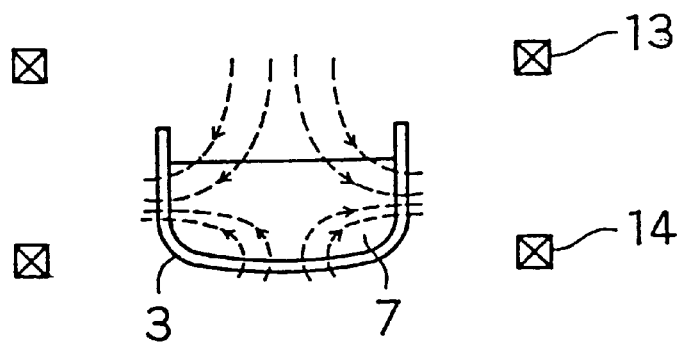
FIG. 3 is a schematic view showing the first method according to an embodiment of the invention in which the temperature fluctuation range of the melt is increased in the cusp magnetic field applied semiconductor single crystal fabrication apparatus.

At the beginning of contracting step, according to the first method in which the temperature fluctuation of the melt 7 is allowed to be greater than 5° C., one of the magnetic field of the upper magnet 13 and the lower magnet 14 is strong and the other is weak. FIG. 3 is a schematic view showing that the magnetic lines wherein the magnetic field intensity of the upper magnet 13 is strong and the magnetic field intensity of the lower magnet 14 is weak. In FIG. 3, only the quartz crucible, melt and magnets are shown, the other parts of the apparatus are omitted. When the magnetic field intensity of the upper magnet 13 is $B_U$ and the magnetic field intensity of the lower magnet 14 is $B_L$, the amount of respective increase and decrease of the magnetic field intensities should satisfy the following formula:

$$1.0 < B_U \div B_L \leq 3.0$$

In the case that the value of $B_U \div B_L$ is not more than 1.0, a center of the magnetic field is located above the melt surface and magnetic field at the melt surface is vertical magnetic field which is vertical to the melt, it is difficult to control a temperature near the melt surface.

On the other hand, in the case that the value of $B_U \div B_L$ excess 3.0, a center of the magnetic field is located under the melt surface and magnetic field at the melt surface is vertical magnetic field which is vertical to the melt, it is difficult to control a temperature near the melt surface. The magnetic lines of the upper magnet 13 enter the melt 7 almost vertically from the top, and curve in an almost horizontal direction from the beneath of the surface of the melt 7 and penetrate the side wall of the quartz crucible 3 almost orthogonally. Accordingly, the vicinity of the surface of the melt 7 is almost similar to a longitudinal magnetic field and thus the up and down convection of the melt 7 is activated. And thus the shape of the crystal growth interface changes properly and even the diameter of the contracted portion is larger than 4 mm, dislocation free state is achieved.

Figure 4:
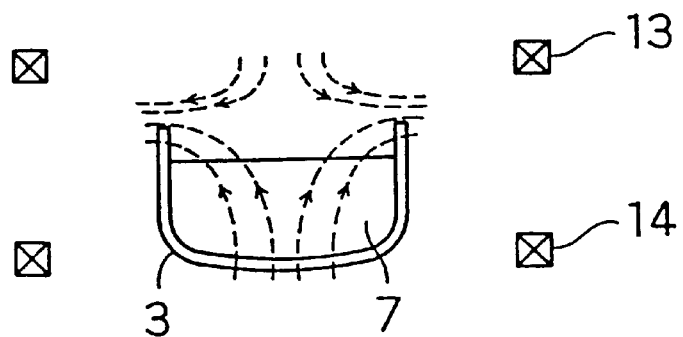
FIG. 4 is a schematic view showing the first method according to another embodiment of the invention in which the temperature fluctuation range of the melt is increased in the cusp magnetic field applied semiconductor single crystal fabrication apparatus.

FIG. 4 is a schematic view showing the magnetic lines wherein the magnetic field intensity of the upper magnet 13 is weak and the magnetic field intensity of the lower magnet 14 is strong. When the magnetic field intensity of the upper magnet 13 is $B_U$ and the magnetic field intensity of the lower magnet 14 is $B_L$, the amount of respective increase and decrease of the magnetic field intensity should satisfy the following formula:

$$1.0 < B_U \div B_L \leq 3.0$$

The magnetic lines of the lower magnet 14 enter the melt 7 almost vertically from the lower part of the quartz crucible 3, penetrate the melt 7 and curve in an almost horizontal direction from the top of the surface of the melt 7. Accordingly, the vicinity of the surface of the melt 7 is almost similar to a longitudinal magnetic field and thus the up and down convection of the melt 7 is activated. Accordingly, the shape of the crystal growth interface changes properly and even though the diameter of the contracted portion is larger than 4 mm, dislocation free state is achieved.

Figure 5:
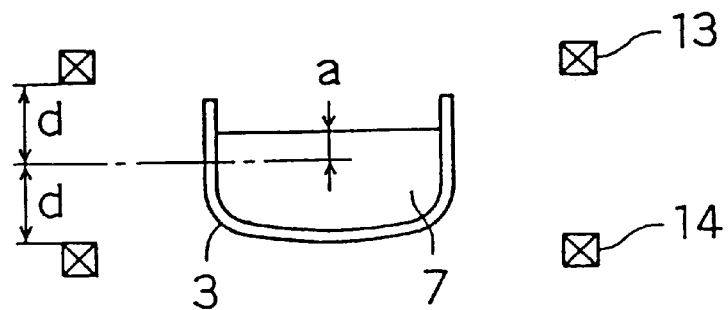
FIG. 5 is a schematic view showing the corresponding positions of the melt surface and the magnets according to the second method in which the temperature fluctuation range of the melt is increased in the cusp magnetic field applied semiconductor single crystal fabrication apparatus.

In the cusp magnetic field-applied semiconductor single crystal fabrication apparatus, in case the second method in which the temperature fluctuation range of the melt is set larger than 5° C., the upper magnets and the lower magnets can be moved simultaneously in the vertical direction. FIG. 5 is a schematic view showing the position relationship between the melt surface and the magnets. If the space between the upper magnet 13 and the lower magnet 14 is "2d", the distance from the central line of the upper magnet and the lower magnet to the melt surface is "a", then the moving of the upper and lower magnets should satisfy the following formula:

$$0 < a \leq 2d$$

Figure 6:
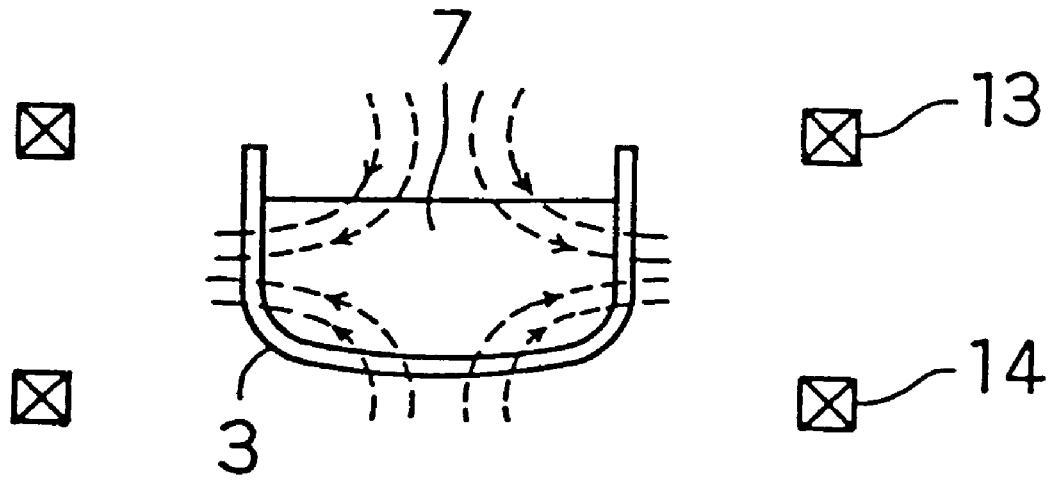
FIG. 6 is a schematic view showing the second method according to an embodiment of the invention in which the temperature fluctuation range of the melt is increased in the cusp magnetic field applied semiconductor single crystal fabrication apparatus.
Figure 7:
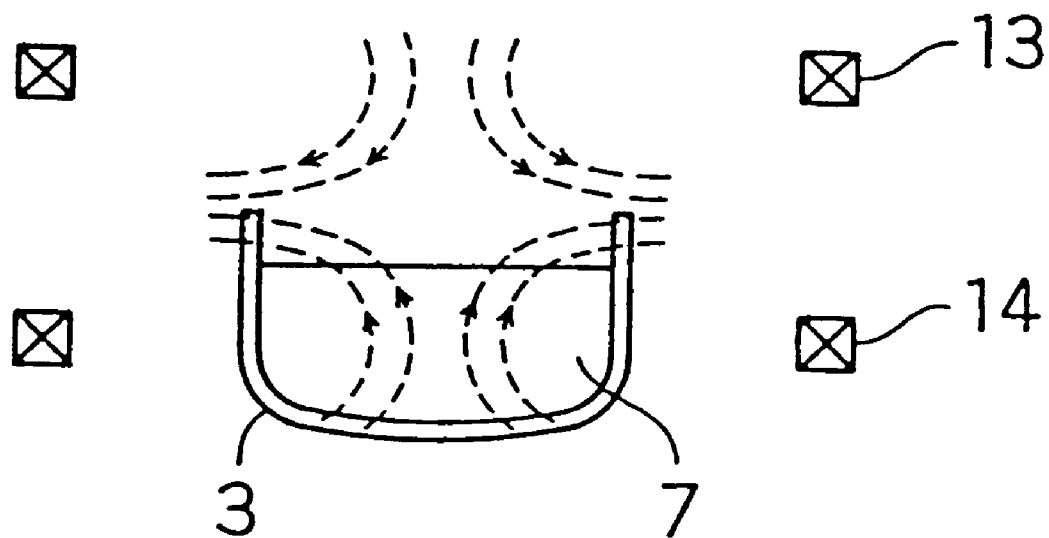
FIG. 7 is a schematic view showing the second method according to another embodiment of the invention in which the temperature fluctuation range of the melt is increased in the cusp magnetic field applied semiconductor single crystal fabrication apparatus.

If the level of the melt surface excess between the upper magnet 13 and the lower magnet 14, a magnetic field in the vicinity of the melt surface is similar to a longitudinal magnetic field and it is difficult to eliminate a convection in a vertical direction and fabricate a contracted portion. Referring to FIG. 6 which shows the upper magnets 13 and the lower magnets 14 moved to the below, the magnetic lines of the upper magnets 13 enter the melt 7 almost vertically from the top, as in the FIG. 3, and curve at the beneath of the surface of the melt 7 almost horizontally, penetrating the side wall of the quartz crucible 3 almost orthogonally. Referring to FIG. 7 which shows the upper magnets 13 and the lower magnets 14 moved to the top, the magnetic lines of the lower magnet 14 enter the melt 7 almost vertically from the lower part of the crucible, as in FIG. 4, and penetrate the melt 7 and curve in at the top of the surface of the melt almost horizontally. In all cases, the vicinity of the melt surface is similar to a longitudinal magnetic field, the up and down convection of the melt 7 is activated, and thus the shape of the crystal growth interface changes properly and even though the diameter of the contracted portion is larger than 4 mm, dislocation free state is achieved.

As indicated above, in the contracting step, when a transverse magnetic field is used, by lowering the magnetic field intensity below 2000 gauss, and when a cusp magnetic field is used, by increasing and decreasing the magnetic field intensity of the upper and lower magnets or moving the upper and lower magnets in the vertical direction to make the vicinity of the melt surface similar to a longitudinal magnetic field, the change of the shape of the crystal growth interface becomes large. In all cases, the rate of free dislocation is increased to 90% as compared with the 50% when pulling by applying magnetic field in the prior art.

As stated above, compared to pulling a semiconductor single crystal by the CZ method, the MCZ method necessitates thinning the diameter of the contracted portion to attain the free dislocation. According to the invention, by weakening the magnetic field intensity or changing the positions of the magnets without changing the magnetic field intensity to make proper change of the crystal growth interface, the free dislocation is easily attained even though the diameter of the contracted portion is larger than that of the prior art. Accordingly, a large diameter, heavy semiconductor single crystal can be safely pulled without breaking the contracted portion, and the semiconductor single crystal yield can be increased.

What is claimed is:

1. A magnetic field applied method of fabricating a semiconductor single crystal, comprising:

immersing a seed crystal in a melt;

forming a contracted portion by pulling up the seed crystal so as to have a small diameter while applying a magnetic field to the melt;

forming a shoulder portion by pulling up the seed crystal so as to have a gradually increasing diameter while applying the magnetic field to the melt; and forming a straight cylindrical portion by pulling up the seed crystal so as to have a constant diameter longitudinally while applying the magnetic field to the melt;

wherein the step of forming a contracted portion is performed while changing the shape of the crystal growth interface said changing being accomplished by keeping the range of the temperature fluctuation caused by convection in the vicinity of the melt surface to more than 5° C. so as to eliminate dislocation in the contracted portion.

2. The fabrication method as claimed in claim 1, wherein the step of forming the contracted portion is performed while applying a transversal magnetic field having intensity below 2000 Gauss, and the step of forming the shoulder portion is performed while applying the transversal magnetic field with an intensity more than that in the step of forming the contracted portion.

3. The fabrication method as claimed in claim 1, wherein the magnetic field is a cusp magnetic field formed by upper and lower magnets and the step of forming the contracted portion is performed while increasing a magnetic field intensity of one of the upper and lower magnets and decreasing a magnetic field intensity of the other of the upper and lower magnets so as to make the vicinity of the melt surface similar to a longitudinal magnetic field, and the step of forming the shoulder portion is performed while applying the cusp magnetic field.

4. The fabrication method as claimed in claim 1, wherein the magnetic field is a cusp magnetic field formed by upper and lower magnets and the step of forming the contracted portion is performed while moving the upper and lower magnets in a vertical direction so as to make the vicinity of the melt surface similar to a longitudinal magnetic field, and the step of forming the shoulder portion is performed after recovering the position of the upper and lower magnets.

5. An apparatus for fabricating a semiconductor single crystal, comprising:

a crucible filled with a raw material;

a heater for melting the raw material to a melt;

a magnetic means for applying a magnetic field to the melt in the crucible;

a lifting means for lifting a seed crystal immersed in the melt; and a controlling means for controlling the magnetic means and changing the magnetic filed applied to the melt so as to synchronize with the lifting means;

wherein the magnet controlling means is controllable to keep the range of the temperature fluctuation caused by convection in the vicinity of the melt surface to more than 5° C.

6. The apparatus for fabricating a semiconductor single crystal as claimed in claim 5, wherein the controlling means controls the step of forming a contracted portion and a step of forming the shoulder portion, wherein said step of forming a contracted portion is performed while applying a transversal magnetic field having intensity below 2000 Gauss, and the step of forming the shoulder portion is performed while applying the transversal magnetic field having intensity more than that of forming the contracting portion.

7. The apparatus for fabricating a semiconductor single crystal as claimed in claim 5, wherein the magnetic field is a cusp magnetic field formed by upper lower magnets and a magnetic field intensity of one of the upper and lower magnets can be increased and a magnetic field intensity of the other of the upper and lower magnets can be decreased so as to make the vicinity of the melt surface similar to a longitudinal magnetic field.

8. The apparatus for fabricating a semiconductor single crystal as claimed in claim 5, wherein the magnetic field is a cusp magnetic field formed by upper and lower magnets and the the upper and lower magnets can be moved in a vertical direction so as to make the vicinity of the melt surface similar to a longitudinal magnetic field.

* * * * *